United States Patent
Audette et al.

(10) Patent No.: US 11,322,473 B2
(45) Date of Patent: May 3, 2022

(54) INTERCONNECT AND TUNING THEREOF

(71) Applicant: International Business Machines Corporation, Armonk, NY (US)

(72) Inventors: David Audette, Colchester, VT (US); Grant Wagner, Jericho, VT (US); Marc Knox, Hinesburg, VT (US); Dennis Conti, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 127 days.

(21) Appl. No.: 16/568,598

(22) Filed: Sep. 12, 2019

(65) Prior Publication Data
US 2021/0082860 A1   Mar. 18, 2021

(51) Int. Cl.
G06F 21/75   (2013.01)
H01L 23/00   (2006.01)
G06F 30/394  (2020.01)

(52) U.S. Cl.
CPC ............ H01L 24/33 (2013.01); G06F 30/394 (2020.01); H01L 24/83 (2013.01);
(Continued)

(58) Field of Classification Search
CPC .... G06F 30/23; G06F 30/367; G06F 30/3337; G06F 30/39; G06F 30/398;
(Continued)

(56) References Cited

U.S. PATENT DOCUMENTS

| 4,642,889 A | 2/1987 | Grabbe |
| 5,207,585 A | 5/1993 | Byrnes et al. |

(Continued)

FOREIGN PATENT DOCUMENTS

| CN | 110120357 A | 8/2019 |
| WO | 2004005944 A1 | 1/2004 |
| WO | 2006101861 A2 | 9/2006 |

OTHER PUBLICATIONS

David Audette et al., "Interconnect and Tuning Thereof", U.S. Appl. No. 16/568,596, filed Sep. 12, 2019.
(Continued)

*Primary Examiner* — Mary A Wilczewski
*Assistant Examiner* — Tsz K Chiu
(74) *Attorney, Agent, or Firm* — Cantor Colburn LLP; Samuel Waldbaum

(57) ABSTRACT

Aspects of the invention include a method of tuning an interconnect that couples a first structure that is a first integrated circuit or a first laminate structure to a second structure that is a second integrated circuit or a second laminate structure. The method includes obtaining a compression requirement for a spring in a compliant layer of the interconnect. A longer path length of the spring leads to greater compression and mechanical support. Current and signal speed requirements for the interconnect are obtained. A shorter path length of the spring leads to greater current-carrying capacity and greater signal speed. Specifications for the spring are determined based on the compression requirement and the current and signal speed requirements. Determining the specifications includes determining a number of active coils of the spring to be less than two.

13 Claims, 6 Drawing Sheets

(52) U.S. Cl.
CPC ............... *H01L 2924/01004* (2013.01); *H01L 2924/0105* (2013.01); *H01L 2924/01029* (2013.01)

(58) Field of Classification Search
CPC .. G06F 2111/06; G06F 2111/14; G06F 30/39; H01L 2224/72; H01L 2224/90; H01L 24/13–17; H01L 2223/66; H01L 2223/6605
See application file for complete search history.

(56) References Cited

U.S. PATENT DOCUMENTS

| | | | |
|---|---|---|---|
| 5,800,184 A | 9/1998 | Lopergolo et al. | |
| 5,801,474 A * | 9/1998 | Sakairi | H03H 9/059 310/313 R |
| 5,838,160 A | 11/1998 | Beaman et al. | |
| 5,945,897 A | 8/1999 | Pluymers et al. | |
| 6,068,669 A | 5/2000 | Farnworth et al. | |
| 6,275,052 B1 | 8/2001 | Hembree et al. | |
| 6,405,414 B1 * | 6/2002 | Byrnes | A61M 25/00 24/339 |
| 6,524,115 B1 | 2/2003 | Gates et al. | |
| 6,528,349 B1 | 3/2003 | Patel et al. | |
| 6,615,485 B2 | 9/2003 | Eldridge et al. | |
| 6,624,645 B2 | 9/2003 | Haseyama et al. | |
| 6,624,648 B2 | 9/2003 | Eldridge et al. | |
| 6,830,460 B1 | 12/2004 | Rathburn | |
| 7,121,839 B2 | 10/2006 | Rathburn | |
| 7,135,777 B2 | 11/2006 | Bakir et al. | |
| 7,279,788 B2 | 10/2007 | Canella | |
| 7,349,223 B2 | 3/2008 | Haemer et al. | |
| 7,446,548 B2 | 11/2008 | Chen | |
| 7,726,984 B2 | 6/2010 | Bumb, Jr. et al. | |
| 7,750,487 B2 | 7/2010 | Muthukumar et al. | |
| 8,102,184 B2 * | 1/2012 | Sherry | G01R 1/06716 324/754.03 |
| 8,269,516 B1 | 9/2012 | Mardi et al. | |
| 8,405,414 B2 * | 3/2013 | Durbin | G01R 1/0491 324/754.11 |
| 9,613,911 B2 * | 4/2017 | Rogers | H01L 24/97 |
| 9,659,908 B1 * | 5/2017 | Sahasrabudhe | H01L 25/0657 |
| 9,793,635 B2 | 10/2017 | Lee | |
| 10,438,907 B2 * | 10/2019 | Hu | H01L 23/66 |
| 2002/0075025 A1 | 6/2002 | Tanaka | |
| 2002/0110757 A1 * | 8/2002 | Fork | H01L 21/4853 430/320 |
| 2004/0200187 A1 | 10/2004 | Warrier et al. | |
| 2005/0040540 A1 * | 2/2005 | Haba | H01L 24/81 257/778 |
| 2007/0124707 A1 * | 5/2007 | Sutjahjo | G06F 30/23 716/113 |
| 2011/0060562 A1 * | 3/2011 | Yilbas | G06F 30/23 703/2 |
| 2011/0114377 A1 * | 5/2011 | Brun | H01L 25/0657 174/260 |
| 2012/0051005 A1 * | 3/2012 | Vanfleteren | H01L 23/3142 361/749 |
| 2012/0052268 A1 * | 3/2012 | Axisa | H01L 23/4985 428/212 |
| 2014/0220422 A1 * | 8/2014 | Rogers | H01L 23/08 429/163 |
| 2014/0262498 A1 | 9/2014 | Hester et al. | |
| 2017/0092556 A1 * | 3/2017 | Gustafson | H01C 7/18 |
| 2019/0102505 A1 * | 4/2019 | Audet | G06F 30/392 |
| 2020/0106181 A1 * | 4/2020 | Avser | H01Q 9/0435 |

OTHER PUBLICATIONS

List of IBM Patents or Patent Applications Treated as Related; (Appendix P), Filed Sep. 12, 2019; 2 pages.
Zhou et al., "Coplanarity analysis and control of spring probe heads for wafer testing", Chip Scale Review, Feb. 2015, pp. 1-4.
International Search Report and Written Opinion for PCT/IB2020/057076 dated Nov. 10, 2020, pp. 1-9.

\* cited by examiner

US 11,322,473 B2

INTERCONNECT AND TUNING THEREOF

BACKGROUND

The present invention generally relates to integrated circuit (i.e., chip) packaging, and more specifically, to an interconnect and the tuning thereof.

A chip includes a number of circuits and components (e.g., gates, flip-flops) to implement the functionality specified for the chip. The size of a chip (e.g., on the order of 1 inch squared) can make it challenging to access a signal on the chip. Typically, solder bumps are included as a way to access signals on the chip. For example, a wafer probe device relies on electrical contact between the solder bumps of the chip and a test pattern generator. Outside the wafer probing and testing context, there can still be a need to facilitate access to signals of the chip.

SUMMARY

Embodiments of the present invention are directed to tuning a chip interconnect. A non-limiting exemplary method of tuning an interconnect that couples a first structure that is a first integrated circuit or a first laminate structure to a second structure that is a second integrated circuit or a second laminate structure includes obtaining a compression requirement for a spring in a compliant layer of the interconnect. A longer path length of the spring leads to greater compression and mechanical support. The method also includes obtaining current and signal speed requirements for the interconnect. A shorter path length of the spring leads to greater current-carrying capacity and greater signal speed. The method further includes determining specifications for the spring based on the compression requirement and the current and signal speed requirements. The determining the specifications includes determining a number of active coils of the spring to be less than two.

Other embodiments of the present invention relate to the above-described interconnect.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
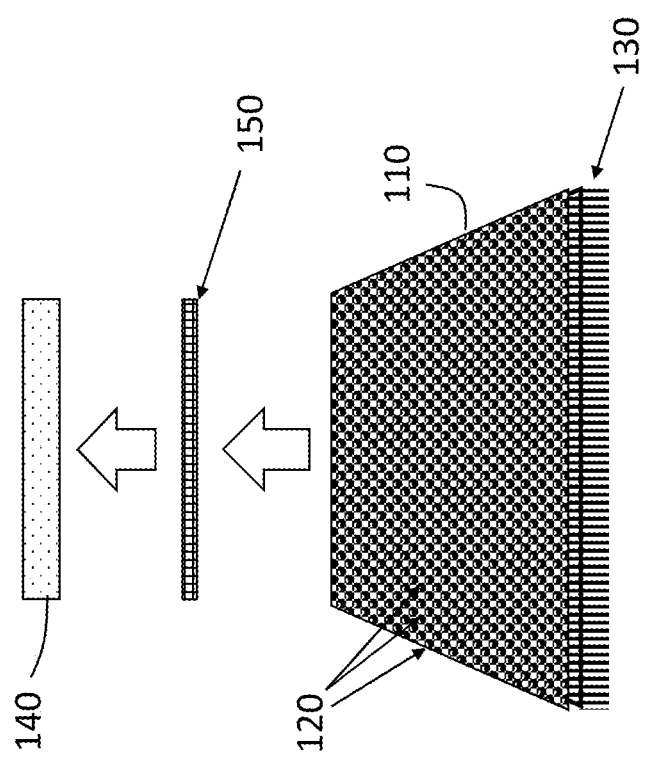
FIG. 1 illustrates an interconnect in accordance with one or more embodiments of the present invention that couples in integrated circuit to a laminate structure.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, an interconnect that provides access to a chip can be needed outside the context of wafer testing. The interconnect can couple directly to a chip on one or both sides or to a laminate structure that couples to a chip. The laminate structure can couple to a chip, printed circuit board (PCB), or other device in turn. In this way, the interconnect can facilitate a change in pitch from the chip on one side to the PCB or other device on the other, for example. The interconnect forms an electrical and mechanical connection with solder bumps of the chip on one side while mechanically decoupling the chip from the chip or laminate structure on the other side. As chips are designed and fabricated for higher power operation, prior interconnects are unable to convey sufficiently high current at sufficiently high speeds to the solder bumps of the chip.

One or more embodiments of the present invention provide an interconnect and the tuning thereof. The interconnect facilitates high power and high speed operation. Specifically, a spring is soldered between two laminate structures (i.e., organic substrates), between a laminate structure and a chip, or between two chips. The tuning of the interconnect refers to the design of the spring being specific to a particular application. For a particular chip and application, the spring must exhibit sufficient compliance (i.e., compression) to properly couple with the structure (e.g., chip, laminate structure) on either side while also exhibiting sufficiently low resistive heating to carry the current needed at the required speed. Thus, given the deformation, current, and speed requirements, the material of the spring, coil diameter, wire diameter, pitch, and the number of coils can be determined as detailed. The spring includes an active coil between two inactive (i.e., dead) coils that are soldered to the laminate layers. The inactive coils provide mechanical support but can negatively affect power and speed by increasing path length and, consequently, electrical resistance, which increases resistive heating. The active coils facilitate compliance by the spring but can also negatively affect power and speed by increasing path length and, thus, electrical resistance and resistive heating. Thus, the necessary compliance, speed, and current are balanced in the design of the spring according to one or more embodiments of the invention.

Figure 2:
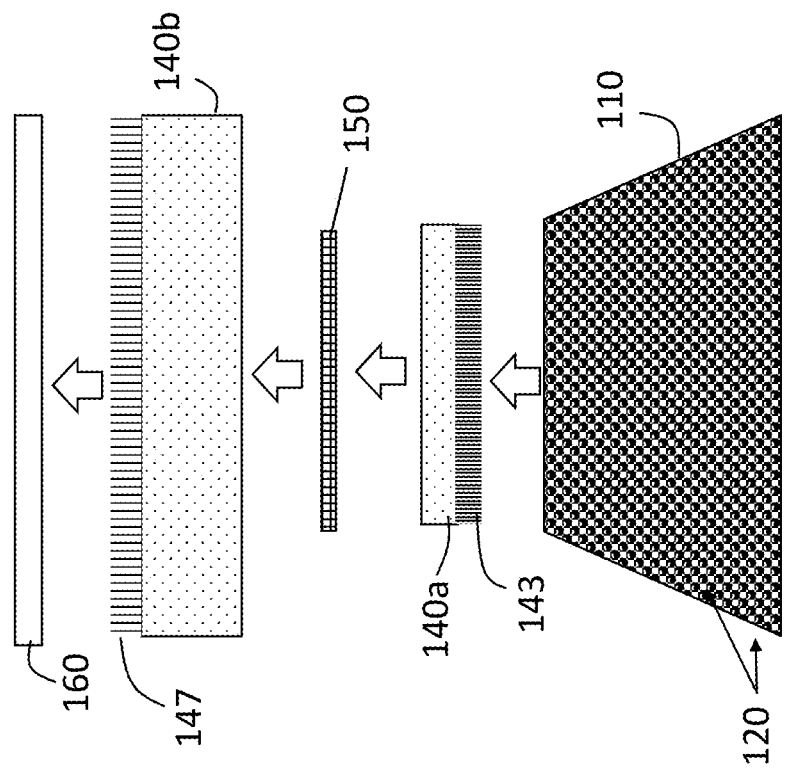
FIG. 2 illustrates an interconnect in accordance with one or more embodiments of the present invention that couples two laminate structures.
Figure 3:
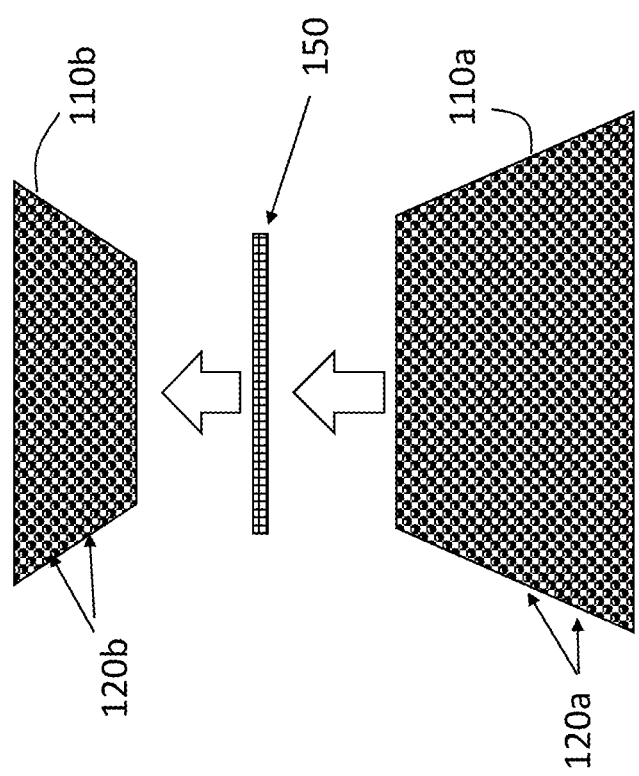
FIG. 3 illustrates an interconnect in accordance with one or more embodiments of the present invention that couples two integrated circuits.

FIGS. 1-3 show an interconnect 150 used in different scenarios according to one or more embodiments of the invention. FIG. 1 shows an interconnect 150 according to one or more embodiments of the present invention that couples an integrated circuit 110 (i.e., microcircuit or chip) to a laminate structure 140. Generally, the interconnect 150 includes a compliant layer 410 with solder layers 420 on either side to couple two different structures (e.g., an integrated circuit 110, a laminate structure 140), as detailed with reference to FIG. 4. As shown in FIG. 1, the integrated circuit 110 includes solder bumps 120 that can be soldered to the interconnect 150 on one side. On the opposite side, the interconnect 150 can be soldered to the laminate structure 140. The integrated circuit 110 is shown with a heatsink 130 below it. The compliance of the interconnect 150 facilitates a closer fit between the integrated circuit 110 and the heatsink 130 on the opposite side of the integrated circuit 110 to the interconnect 150.

FIG. 2 shows an interconnect 150 according to one or more embodiments of the present invention that couples two laminate structures 140a, 140b (generally referred to as 140). As shown, the exemplary interconnect 150 facilitates a change in pitch from the smaller pitch of the laminate structure 140a on one side to the higher pitch of the laminate structure 140b on the other side. The laminate structure 140a is shown with probes 143 that can couple to the solder bumps 120 of an integrated circuit 110. The laminate structure 140b is shown with floating pins 147 that can couple to a PCB 160 or other device.

FIG. 3 shows an interconnect 150 according to one or more embodiments of the present invention that couples two integrated circuits 110a, 110b (generally referred to as 110). The interconnect 150 couples to the solder bumps 120 of one of the integrated circuits 110 on one side and to the solder bumps 120 of the other one of the integrated circuits 110 on the other side. As further discussed with reference to FIG. 4, the compliant layer 410 includes an array of springs 400. Each spring 400 can be soldered to one of the solder bumps 120 of the integrated circuit 110.

Figure 4:
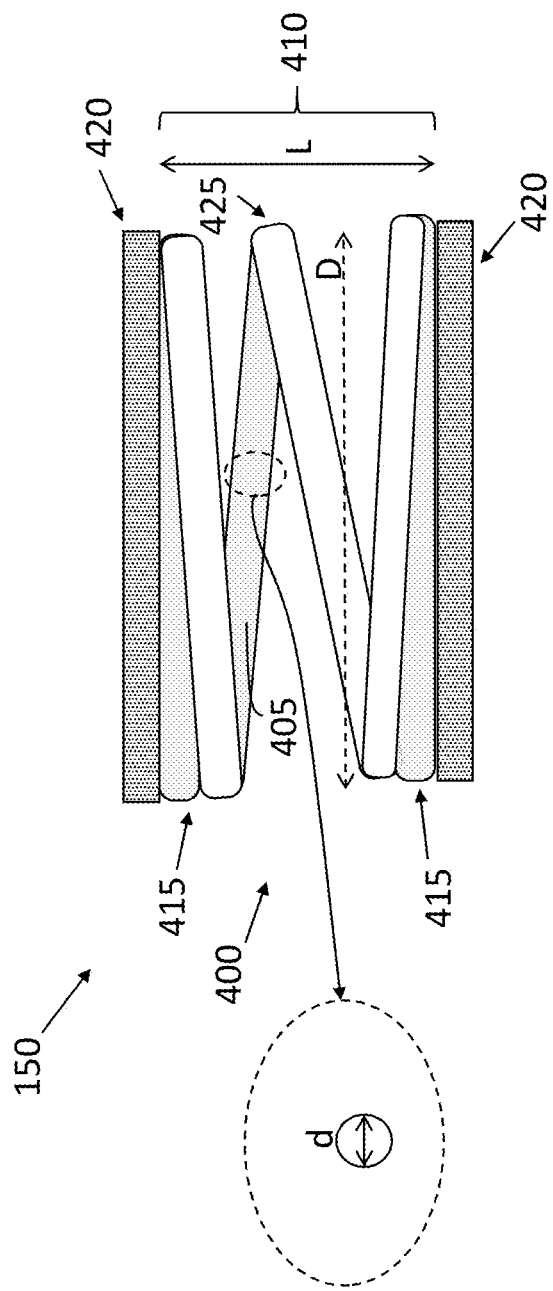
FIG. 4 details aspects of the compliant layer of the interconnect according to one or more embodiments of the invention.

FIG. 4 details aspects of the interconnect 150 according to one or more embodiments of the invention. The interconnect 150 includes an array of springs 400 that make up the compliant layer 410. Solder layers 420 on each side of each spring 400 couple the interconnect 150 to a microcircuit 110 or laminate structure 140 according to the exemplary scenarios shown in FIGS. 1-3. The exemplary spring 400 in FIG. 4 includes one active coil 425 between dead or inactive coils 415. That is, the spring 400 is shown with one revolution (i.e., complete turn) of the wire 405 that makes up the spring 400 that is configured in a way that is compressed or deformed. One inactive coil 415 (i.e., one revolution of the wire 405 that is configured in a way that it cannot be compressed) is shown on either end of the exemplary spring 400. The design of the spring 400 is specific to the application of the interconnect 150. That is, the number of the active coils 425 is limited (e.g., less than two) and the number of inactive coils 415 is limited (e.g., less than two) based on the current that must be transmitted through the interconnect 150 and the signal speed required. At the same time, a longer spring 400 with more active coils 425 can provide greater compression and mechanical support.

Specifically, resistive heating (i.e., ohmic or Joule heating) is generated by current transmitted through the spring 400. This resistive heating increases with path length (i.e., length of the spring 400). If the resistive heating reaches an upper threshold, due to the path length of the spring 400 being too long for the current being conveyed, the springe 400 breaks down. That is, the spring 400 no longer serves the mechanical support function properly. Thus, the path length of the spring 400 must be kept sufficiently small to avoid the threshold resistive heating for a given expected current transmission. The fact that the speed of transmission of a signal through the spring 400 is also improved with reduced path length is more intuitively understandable. However, mechanical support is increased with an increased path length of the spring 400. The method 500 discussed with reference to FIG. 5 addresses these competing interests in designing the interconnect 150.

Designing the interconnect 150 includes determining a number of specifications for the springs 400 of the array that makes up the compliant layer 410. One such specification is the material used to form the spring 400. Exemplary materials include tin solder 420 and beryllium copper for the spring 400. Another specification is the diameter of the spring D, referred to as the coil diameter. The wire diameter d, shown in the cross-sectional view, is also determined. The pitch of the spring 400 specifies the number of revolutions or coils per the length L. In addition, the total number of active coils 425 and inactive coils 415 must be determined.

Figure 5:
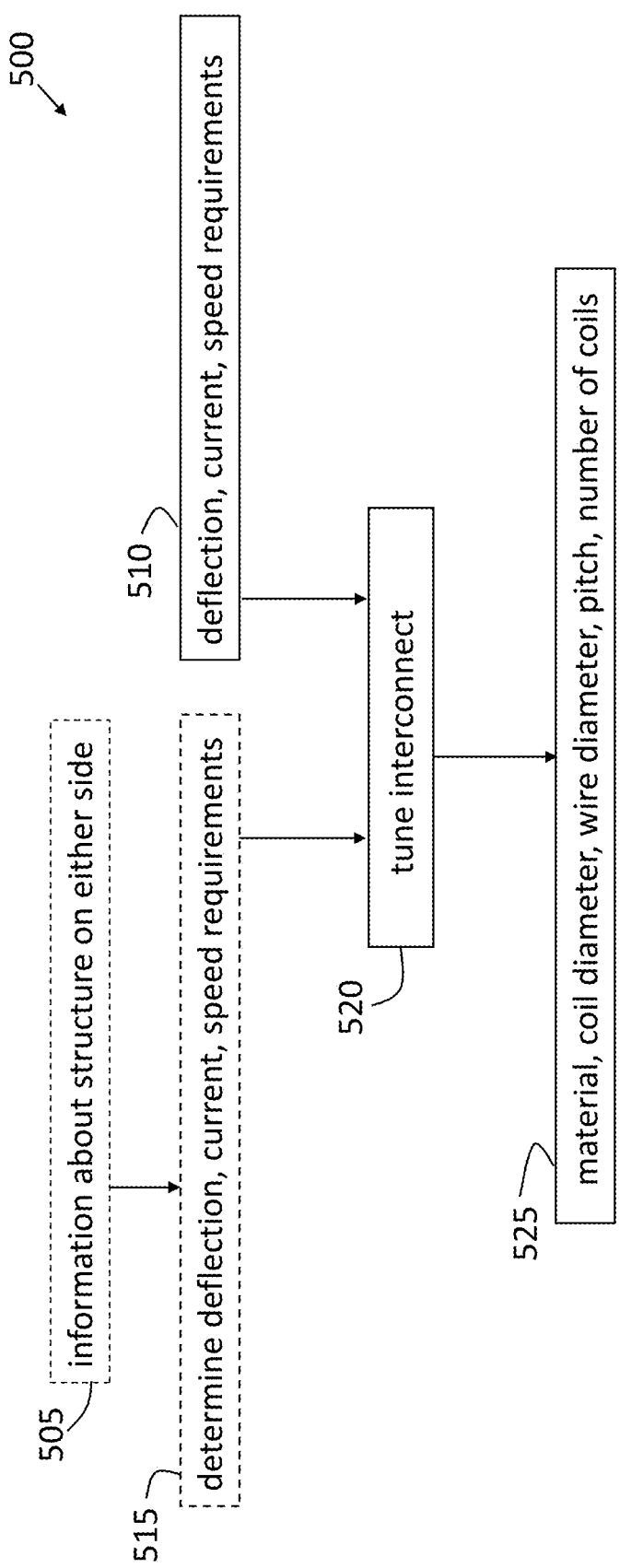
FIG. 5 is a process flow of a method of tuning a chip interconnect according to one or more embodiments of the invention.

FIG. 5 is a process flow of a method 500 of tuning a chip interconnect 150 according to one or more embodiments of the invention. At block 510, the method 500 includes obtaining deflection, current, and speed requirements. According to an alternate embodiment, instead of obtaining the requirements, at block 510, the requirements can be determined. Thus, at block 505, obtaining information about the structure (e.g., integrated circuit 110, laminate structure 140) on either side of the interconnect 150 includes obtaining dimensions of both, timing specifications of the integrated circuit 110, and power levels to facilitate determining compression, current, and speed requirements at block 515. At block 520, performing tuning of the interconnect 150 includes tuning the spring 400. Tuning the spring 400 refers to the fact that the specifications of the spring 400 must be refined to satisfy the countervailing interests of mechanical support and compliance on the one hand and current and signal speed on the other.

As part of the process at block 520, designing the spring 400 may be implemented by a machine learning algorithm. Alternately, a rule-based approach can match a range of current, speed, and deflection values to a set of specifications for the spring 400. In addition, finite element analysis (FEA) can be used to simulate compression and other aspects of a candidate design prior to manufacture of the springs 400. Exemplary processing circuitry 610 that can be used to implement the process at block 520 is detailed with reference to FIG. 6. Regardless of the specific implementation, the design involves including inactive coils 415 and active coils 425 sufficient to provide the required mechanical support and compliance without exceeding the path length dictated by the required current and signal speed. Accordingly, at block 525, the method 500 includes providing the material, coil diameter D, wire diameter d, pitch, and number of coils 415, 425. Once the interconnect 150 is assembled based on the design, at block 520, solder layers 420 can be used to couple the interconnect 150 to a different structure (e.g., integrated circuit 110, laminate structure 140) on either side as shown in FIGS. 1-3, for example.

Figure 6:
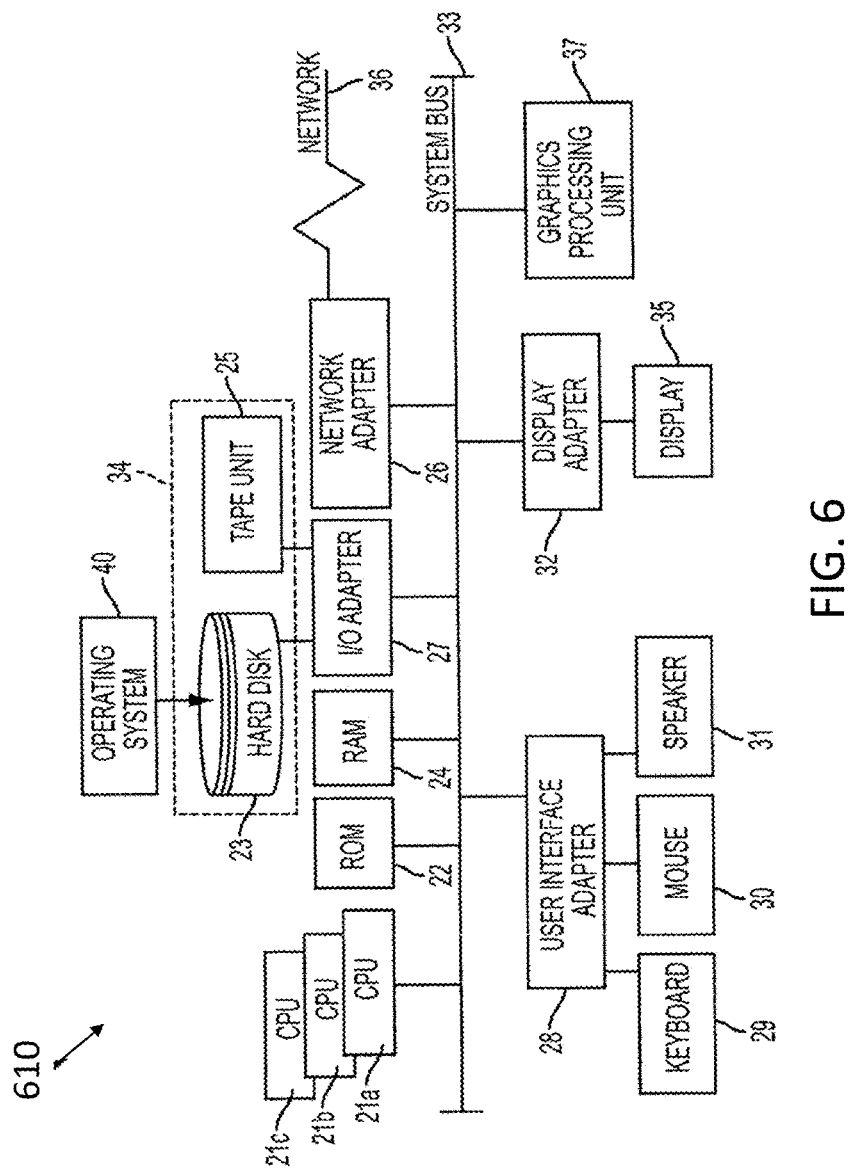
FIG. 6 is a block diagram of exemplary processing circuitry to design the interconnect according to one or more embodiments of the invention.

FIG. 6 is a block diagram of processing circuitry 610 that can perform the design of the interconnect 150 at block 520 (FIG. 5). As previously noted, according to an exemplary embodiment of the invention, the processing circuitry 610 can implement a machine learning algorithm to balance the competing interests of increasing deflection and mechanical support on one hand and increasing current-carrying capacity and speed on the other to determine specifications of the spring 400. According to another exemplary embodiment of the invention, the processing circuitry 610 can implement a rule-based algorithm that uses ranges of values for deflection, current, and speed to map to specifications for the spring 400.

The processing circuitry 610 includes one or more central processing units (processors) 21*a*, 21*b*, 21*c*, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of the processing circuitry 610.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution can be stored in mass storage 34. The RAM 22, ROM 24, and mass storage 34 are examples of memory 19. A network adapter 26 interconnects system bus 33 with an outside network 36 enabling the processing circuitry 410 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, the processing circuitry 610 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, the processing circuitry 610 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the processing circuitry 610.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/ connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of tuning an interconnect that couples a first structure that is a first integrated circuit or a first laminate structure to a second structure that is a second integrated circuit or a second laminate structure, the computer-implemented method comprising:
   obtaining, using a processor, a compression requirement for a helical spring in a compliant layer of the interconnect, wherein the compression requirement indicates a required compliance of the spring to couple the interconnect that includes the spring to the first integrated circuit or the first laminate structure on a first side of the interconnect and to the second integrated circuit or the second laminate structure on a second side, opposite the first side, of the interconnect, and a longer path length of the spring leads to greater compression and mechanical support;
   obtaining, using the processor, current and signal speed requirements for the interconnect, wherein the signal speed requirement indicates a speed with which a signal from the first integrated circuit or the first laminate structure on the first side of the interconnect must reach the second integrated circuit or the second laminate structure on the second side of the interconnect through the spring, and a shorter path length of the spring leads to greater current-carrying capacity and greater signal speed; and
   determining, using the processor, specifications for the spring based on the compression requirement and the current and signal speed requirements, wherein the determining the specifications includes determining a number of active coils of the spring to be less than two.

2. The computer-implemented method according to claim 1, wherein the determining the specifications for the spring includes determining a material for a wire forming the spring.

3. The computer-implemented method according to claim 2, wherein the determining the specifications for the spring includes determining a diameter of the wire.

4. The computer-implemented method according to claim 1, wherein the determining the specifications for the spring includes determining a diameter of the spring and a pitch of the spring that indicates a total number of coils per length.

5. The computer-implemented method according to claim 4, wherein the determining the specifications for the spring includes determining the total number of coils, wherein the total number of coils includes the number of active coils and a number of inactive coils.

6. The computer-implemented method according to claim 1, wherein a machine learning algorithm is used to implement the determining the specifications for the spring.

7. The computer-implemented method according to claim 1, wherein the determining the specifications includes mapping the deflection requirement and the current and speed requirements to the specifications for the spring.

8. A computer program product comprising a computer readable storage medium having program instructions embodied therewith, the program instructions executable by a processor to cause the processor to perform a method of tuning an interconnect that couples a first structure that is a first integrated circuit or a first laminate structure to a second structure that is a second integrated circuit or a second laminate structure, the method comprising:
   obtaining a compression requirement for a helical spring in a compliant layer of the interconnect, wherein the compression requirement indicates a required compliance of the spring to couple the interconnect that includes the spring to the first integrated circuit or the first laminate structure on a first side of the interconnect and to the second integrated circuit or the second laminate structure on a second side, opposite the first side, of the interconnect, and a longer path length of the spring leads to greater compression and mechanical support;
   obtaining current and signal speed requirements for the interconnect, wherein the signal speed requirement indicates a speed with which a signal from the first integrated circuit or the first laminate structure on the first side of the interconnect must reach the second integrated circuit or the second laminate structure on the second side of the interconnect through the spring, and a shorter path length of the spring leads to greater current-carrying capacity and greater signal speed; and
   determining specifications for the spring based on the compression requirement and the current and signal speed requirements, wherein the determining the specifications includes determining a number of active coils of the spring to be less than two.

9. The computer program product according to claim 8, wherein the determining the specifications for the spring includes determining a material for a wire forming the spring.

10. The computer program product according to claim 9, wherein the determining the specifications for the spring includes determining a diameter of the wire.

11. The computer program product according to claim 8, wherein the determining the specifications for the spring includes determining a diameter of the spring and a pitch of the spring that indicates a total number of coils per length.

12. The computer program product according to claim 11, wherein the determining the specifications for the spring includes determining the total number of coils, wherein the total number of coils includes the number of active coils and a number of inactive coils.

13. The computer program product according to claim 8, wherein a machine learning algorithm is used to implement the determining the specifications for the spring, or the determining the specifications includes mapping the deflection requirement and the current and speed requirements to the specifications for the spring.

* * * * *